(12) United States Patent
Voiron et al.

(10) Patent No.: US 12,431,391 B2
(45) Date of Patent: Sep. 30, 2025

(54) METHOD OF FABRICATING A SEMICONDUCTOR STRUCTURE WITH IMPROVED DICING PROPERTIES

(71) Applicant: Murata Manufacturing Co., Ltd., Nagaokakyo (JP)

(72) Inventors: Frédéric Voiron, Barraux (FR); Brigitte Soulier, Grenoble (FR); Hiroshi Nakagawa, Caen (FR)

(73) Assignee: MURATA MANUFACTURING CO., LTD.

( * ) Notice: Subject to any disclaimer, the term of this patent is extended or adjusted under 35 U.S.C. 154(b) by 619 days.

(21) Appl. No.: 17/858,116

(22) Filed: Jul. 6, 2022

(65) Prior Publication Data
US 2022/0352024 A1   Nov. 3, 2022

Related U.S. Application Data

(63) Continuation of application No. PCT/IB2021/050017, filed on Jan. 4, 2021.

(30) Foreign Application Priority Data

Jan. 9, 2020 (EP) .................................. 20305010

(51) Int. Cl.
*H01L 21/78* (2006.01)
*H01L 21/3213* (2006.01)

(52) U.S. Cl.
CPC ........ *H01L 21/78* (2013.01); *H01L 21/32139* (2013.01)

(58) Field of Classification Search
CPC . H01L 21/78; H01L 23/5223; H01L 23/5226; H01L 23/481; H01L 23/49822;
(Continued)

(56) References Cited

U.S. PATENT DOCUMENTS 6,156,672 A * 12/2000 Koshido .................. H10D 1/68
                                                                438/785
6,464,853 B1 * 10/2002 Iwasaki ................ C25D 11/045
                                                                205/124
(Continued)

FOREIGN PATENT DOCUMENTS

EP            3567645 A1     11/2019
TW            I423329 B  *    1/2014

OTHER PUBLICATIONS

International Search Report issued for PCT/IB2021/050017, date of mailing Feb. 11, 2021.
(Continued)

*Primary Examiner* — Zandra V Smith
*Assistant Examiner* — John M Parker
(74) *Attorney, Agent, or Firm* — ArentFox Schiff LLP (57) ABSTRACT

A method of fabricating a semiconductor structure that includes: forming a first metal layer over a wafer; forming a second metal layer over the first metal layer; forming a first porous structure in a first region of the second metal layer located above a circuit area of the wafer and a second porous structure in a second region of the second metal layer located above a dicing area of the wafer, wherein the first porous structure includes a first set of pores, and wherein the second porous structure includes a second set of pores; forming a metal-insulator-metal stack in the first set of pores of the first porous structure; and etching the second set of pores of the second porous structure to expose the dicing area of the silicon wafer.

15 Claims, 11 Drawing Sheets

(58) Field of Classification Search
CPC ... H01L 21/76832; H01L 24/83; H10D 1/716; H10K 71/221
See application file for complete search history.

(56) References Cited

U.S. PATENT DOCUMENTS

| | | | |
|---|---|---|---|
| 2006/0043534 A1* | 3/2006 | Kirby | H01L 21/743 |
| | | | 257/E21.597 |
| 2006/0134879 A1* | 6/2006 | Kim | H01L 23/5223 |
| | | | 438/393 |
| 2011/0073827 A1* | 3/2011 | Rubloff | H10F 77/148 |
| | | | 438/129 |
| 2014/0127897 A1* | 5/2014 | Lee | H01L 21/31144 |
| | | | 438/637 |
| 2019/0096587 A1* | 3/2019 | Shin | H01G 4/306 |
| 2019/0378893 A1* | 12/2019 | Ashimine | H10D 1/043 |
| 2021/0032766 A1* | 2/2021 | Voiron | H01L 23/5223 |

OTHER PUBLICATIONS

Parag Banerjee et al.; "Nanotubular metal-insulator-metal capacitor arrays for energy storage"; Nature Nanotechnology, vol. 4, No. 5, May 2009, pp. 292-296.

* cited by examiner

METHOD OF FABRICATING A SEMICONDUCTOR STRUCTURE WITH IMPROVED DICING PROPERTIES

CROSS REFERENCE TO RELATED APPLICATIONS

The present application is a continuation of International application No. PCT/IB2021/050017, filed Jan. 4, 2021, which claims priority to European Patent Application No. 20305010.9, filed Jan. 9, 2020, the entire contents of each of which are incorporated herein by reference.

FIELD OF THE INVENTION

The present invention relates to the field of integration and, more particularly, to electronic products, related semiconductor products, and their methods of manufacture.

TECHNICAL BACKGROUND

Silicon passive integration technologies are nowadays accessible for industrial design. For example, the PICS technology developed by Murata Integrated Passive Solutions allows integrating high density capacitive components into a silicon substrate. According to this technology, tens or even hundreds of passive components can be efficiently integrated into a silicon die.

In their work titled "Nanotubular metal-insulator-metal capacitor arrays for energy storage" (published in Natural technology, May 2009), P. Banerjee et al. describe a metal-insulator-metal (MIM) structure formed in a porous region, such as anodic aluminum oxide (AAO). Typically, the porous region results from anodizing a layer of metal, such as aluminum. The anodization converts the aluminum layer into AAO. The successive layers of metal, insulator, and then metal follow the contours of the porous region resulting in the MIM structure being embedded inside the pores of the porous region.

Figure 1:
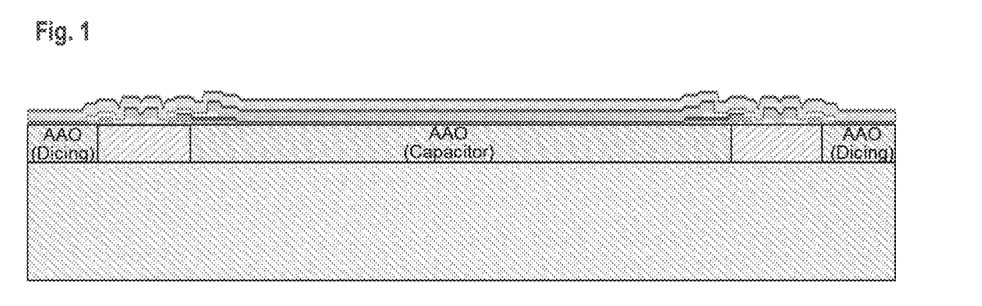
FIG. 1 illustrates a cross-section view of an example wafer structure that includes anodic aluminum oxide (AAO) embedded structures.

Generally, AAO embedded structures as described above are formed on top of a substrate, such as a silicon wafer. In practice, as shown in FIG. 1, the AAO embedded structure is formed in a designated circuit area of the wafer. The wafer is then diced along designated dicing lanes to obtain a die with the AAO embedded structure thereon.

It has been shown that the presence of AAO regions at the edges of the die protects the circuit area from humidity flowing in and reduces the risk of leakage between the top electrode and the bottom electrode (provided by the aluminum layer), phenomena that are frequently observed in subsequent process steps such as wafer bumping. In practice, therefore, AAO regions that are left empty (i.e., without circuitry embedded therein) are formed along designated dicing areas of the wafer as shown in FIG. 1. The wafer is diced along dicing lanes that pass through the dicing areas.

A common technique which may be used for dicing the wafer shown in FIG. 1 is known as "dicing before grinding" (DBG). According to DBG, the wafer is initially trenched (along the dicing lanes) to a depth level before a final target thickness of the die (i.e., the wafer is not diced completely). Then, the wafer is thinned from the bottom to the final target thickness, which results in die separation.

Figure 2:
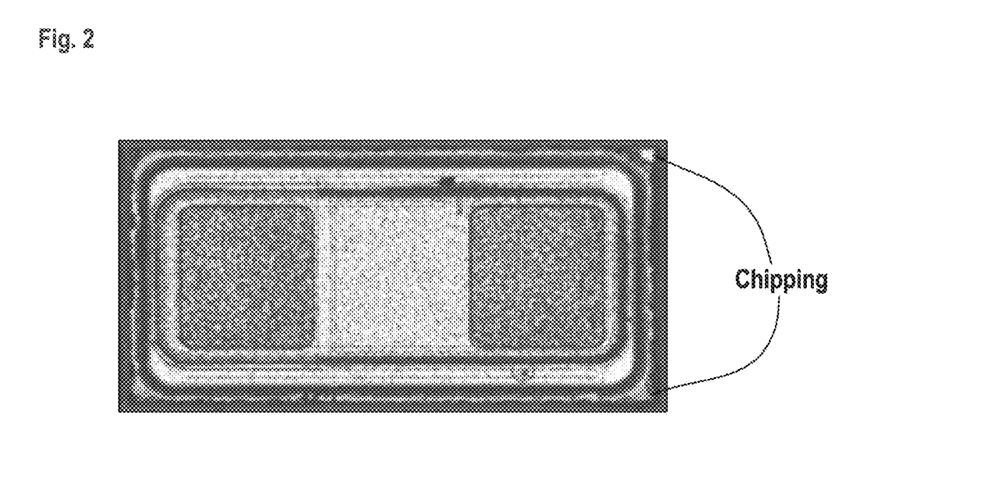
FIG. 2 shows a wafer structure diced using a "dicing before grinding" (DBG) process.

Because die separation occurs during the grinding process, the die resulting from DBG has good mechanical stress and also exhibits reduced backside chipping (chipping is the phenomenon where parts of the die break away from the die). However, topside chipping is harder to eliminate. For example, FIG. 2 shows a top view of a wafer, such as the one shown in FIG. 1, after dicing using DBG. As shown, the resulting die suffers from clearly visible chipping at the edges. Further, this top side chipping does not seem to be affected by the dicing blade used.

Figure 3:
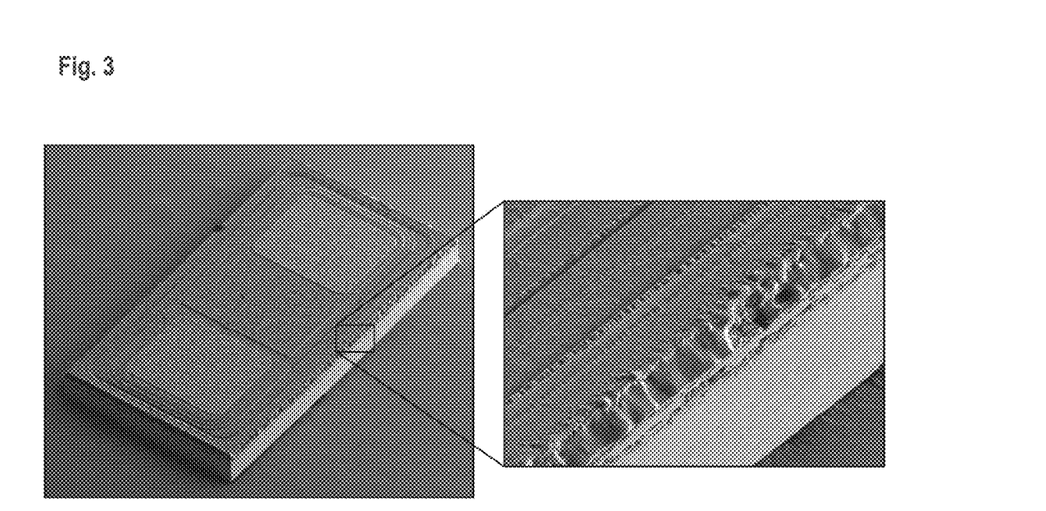
FIG. 3 shows a scanning electron microscopy (SEM) image of a die resulting from the dicing of a wafer structure using a hybrid laser grooving (LG) and DBG process.

Another dicing technique which may be used utilizes laser grooving (LG) followed by grinding as in DBG. According to this hybrid technique, both backside and topside chipping can be significantly reduced or eliminated. However, the mechanical strength of the resulting die is weakened by the application of laser grooving. For example, FIG. 3 shows a scanning electron microscopy (SEM) image of a die resulting from the dicing of a wafer structure using a hybrid LG-DBG process. As shown, the laser grooving results in some melting of the edge AAO region and the supporting substrate may also exhibit cracking and damage.

SUMMARY OF THE INVENTION

The present invention proposes a method of fabricating a semiconductor structure, comprising: defining a circuit area and a dicing area on a silicon wafer; forming a first metal layer over the silicon wafer; forming a second metal layer over the first metal layer; forming a barrier layer over an area of a top surface of the first metal layer located above the circuit area of the silicon wafer; forming a first porous structure in a first region of the second metal layer located above the circuit area and a second porous structure in a second region of the second metal layer located above the dicing area, wherein the first porous structure includes a first set of pores that extend from a top surface of the first porous structure to the barrier layer, and wherein the second porous structure includes a second set of pores that extend from a top surface of the second porous structure to the silicon wafer; forming a metal-insulator-metal (MIM) stack in the first set of pores of the first porous structure; and etching the second set of pores of the second porous structure to expose the dicing area of the silicon wafer.

With the second set of pores etched to expose the dicing area, the silicon wafer may be more easily diced along a dicing lane that passes through the dicing area. Specifically, the dicing of the silicon wafer can be performed with reduced delamination, chipping, and cracks in the supporting substrate.

In an embodiment, the method further comprises dicing the silicon wafer along a dicing lane through the dicing area. The dicing may be performed as part of a DBG or a hybrid LG-DBG process. The resulting structure is a semiconductor structure with AAO embedded circuitry which has an improved mechanical profile, including reduced delamination, chipping, and cracks in the supporting substrate.

Additionally, due to the above fabrication method, the resulting structure benefits from the continued presence of a portion of the second porous structure at its edge(s), which protects the circuit area from humidity flowing in and reduces the risk of leakage in subsequent process steps, particularly wafer bumping.

In an embodiment, the method comprises: forming a first mask layer over the second metal layer, the first mask layer having a first opening above the first region of the second metal layer and a second opening above the second region of the second metal layer; and anodizing the first region and the second region of the second metal layer to form the first porous structure and the second porous structure.

The barrier layer protects the first metal layer in the area located above the circuit area of the silicon wafer. Specifically, the barrier layer may serve to stop the progression of the anodization from reaching the first metal layer over the circuit area. In contrast, no equivalent barrier layer is formed over the equivalent surface of the first metal layer located above the dicing area of the silicon wafer. As such, in an embodiment, the second porous structure extends into a region of the first metal layer underlying the second region of the second metal layer.

Where the barrier layer is formed, the method comprises forming the second metal layer over the first metal layer and the barrier layer.

In another embodiment, the method may comprise patterning the first metal layer to create an opening in the first metal layer over the dicing area of the silicon wafer. The method may then further comprise forming the second metal layer over the first metal layer, the barrier layer, and the dicing area of the silicon wafer. With the first metal layer patterned as such, before forming the second metal layer, the anodization process may be performed in fewer steps as, in this case, the formation of the first porous structure and the second porous structure would require the anodization of layers of substantially equal depth.

In an embodiment, the method comprises: depositing a second mask layer over the first mask layer, the first porous structure, and the second porous structure; patterning the second mask layer to create an opening therein over the first set of pores of the first porous structure; and depositing the MIM stack over the second mask layer.

The second mask layer determines which pores of the first and second porous structures are filled with the MIM stack.

In an embodiment, the second mask layer ensures the MIM stack is formed inside only the first set of pores of the first porous structure, i.e., pores falling in the circuit area and which have substantially the desired directionality and form to be able to reliably embed MIM circuitry.

The second porous structure may include lateral pores located at either side of the second set of pores of the second porous structure.

In an embodiment, the second mask layer covers the second set of pores of the second porous structure. In another embodiment, the second mask layer fully covers the second set of pores and the lateral pores of the second porous structure.

In another embodiment, the second mask layer includes openings over at least some of the lateral pores of the second porous structure. Alternatively or additionally, the openings may be formed over some the second set of pores of the second porous structure, which are adjacent to the lateral pores.

As such, the method may further comprise forming the MIM stack into the first set of pores of the first porous structure and into at least some of the lateral pores of the second porous structure and/or at least some of the second set of pores of the second porous structure, which are adjacent to the lateral pores. The formation of the MIM stack into some of the lateral pores and/or some of the second set of pores adjacent to the lateral pores of the second porous structure results in a semiconductor structure with improved mechanical strength, particularly at the edges.

In an embodiment, the method comprises removing the MIM stack and the second mask layer over the entirety of the second set of pores of the second porous structure.

In another embodiment, the method comprises removing the MIM stack and the second mask layer over a central subset of the second set of pores of the second porous structure.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

Embodiments of the present invention address the existing deficiencies of the prior art by proposing methods of fabricating a semiconductor structure with AAO embedded circuitry having an improved mechanical profile, including reduced delamination, chipping, and cracks in the supporting substrate.

Figure 4A:
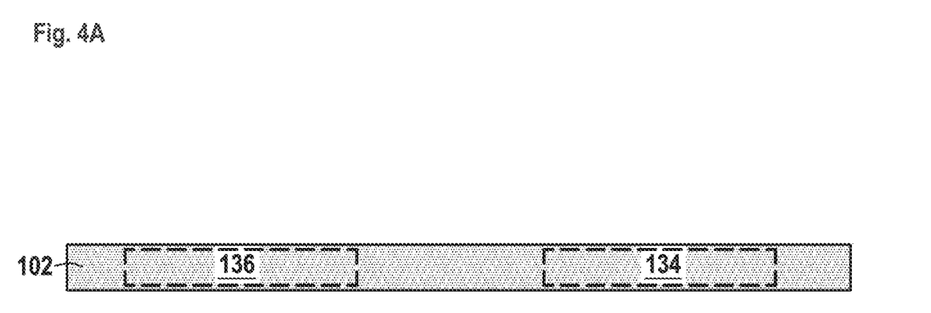
FIGS. 4A-4P illustrate steps of an example process of fabricating a semiconductor structure according to an embodiment.
Figure 4B:
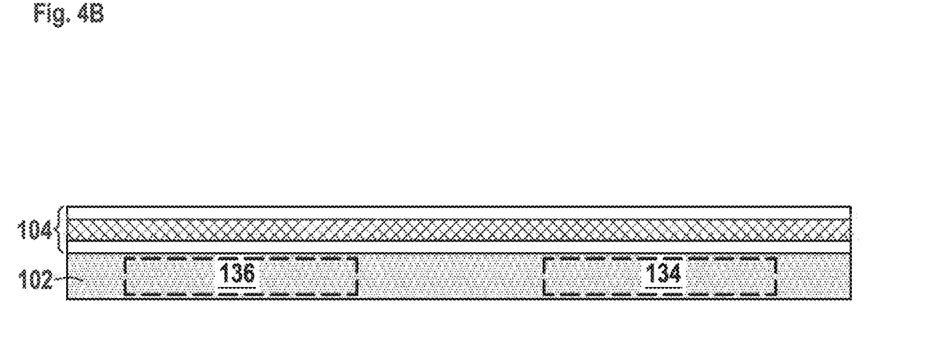
Figure 4C:
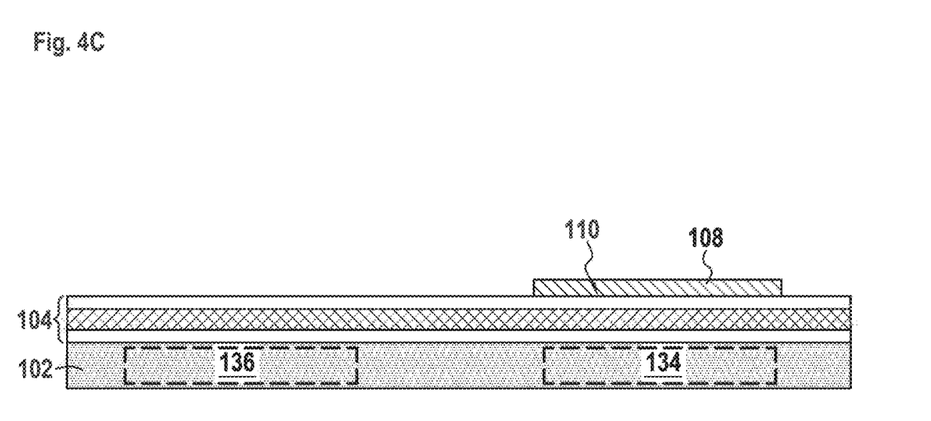
Figure 4D:
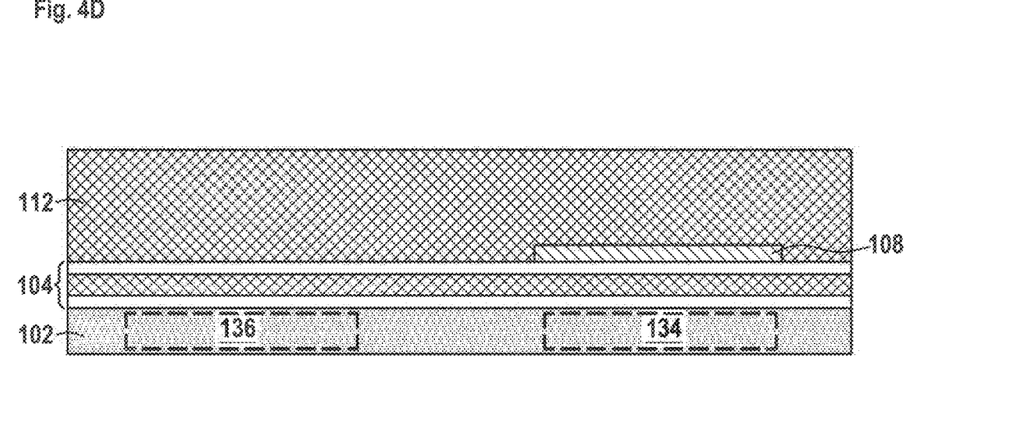
Figure 4E:
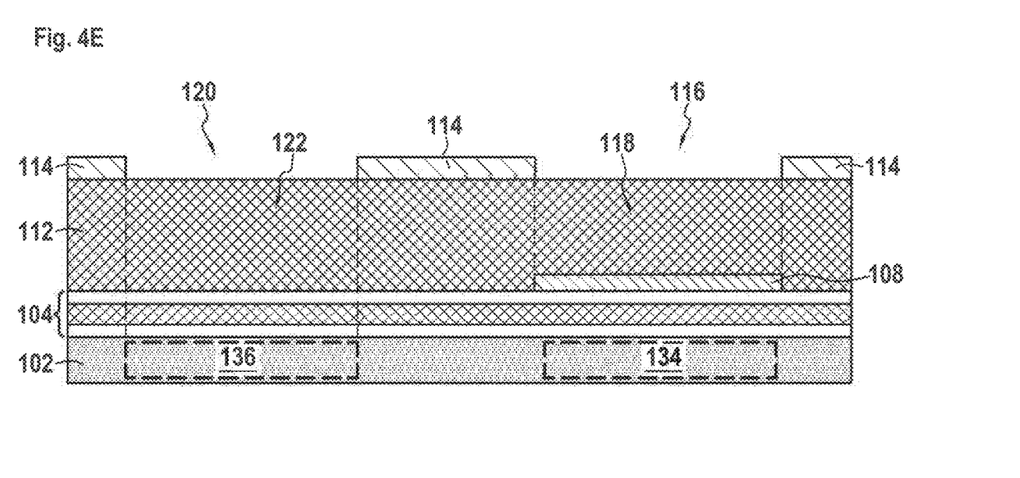
Figure 4F:
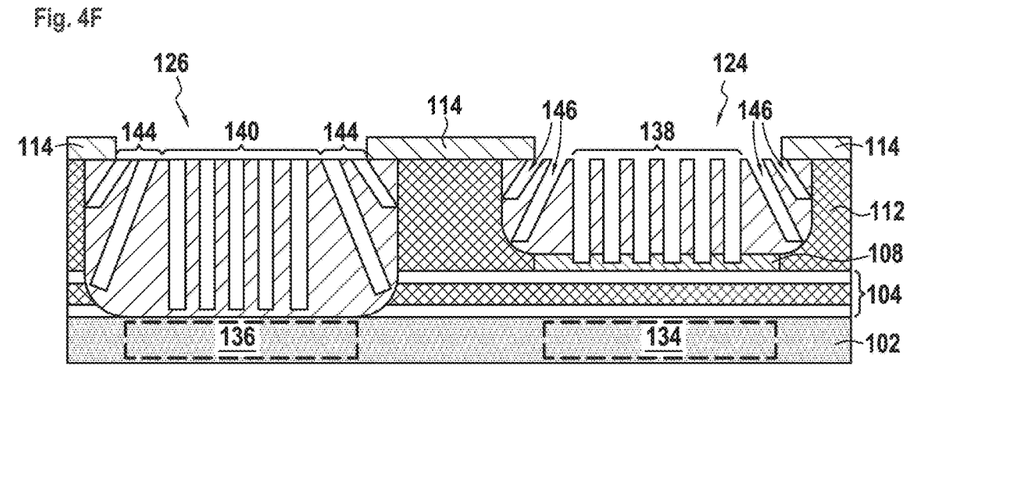
Figure 4G:
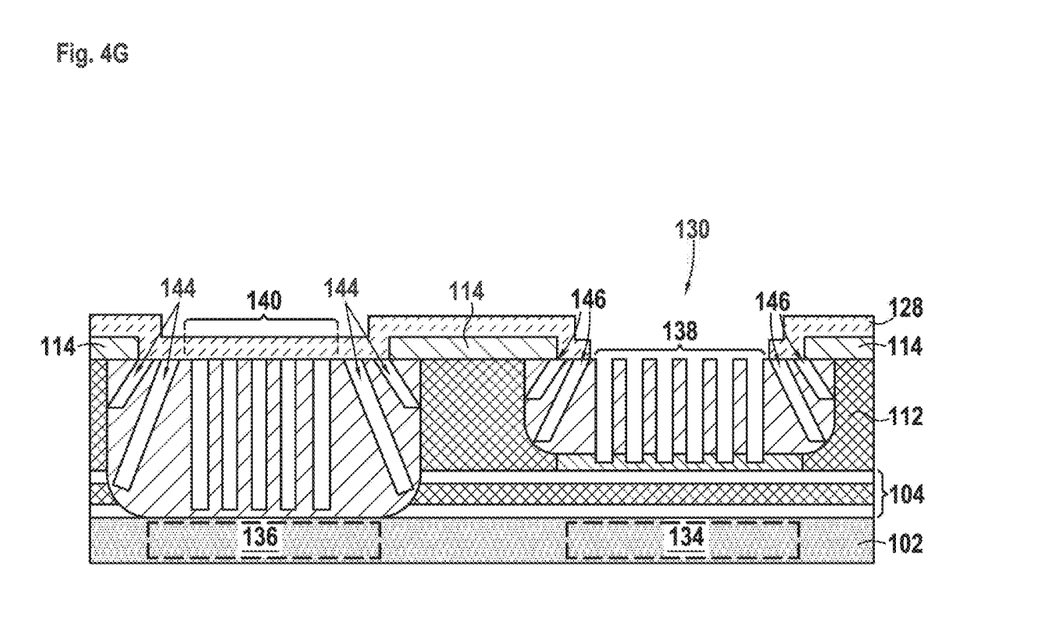
Figure 4H:
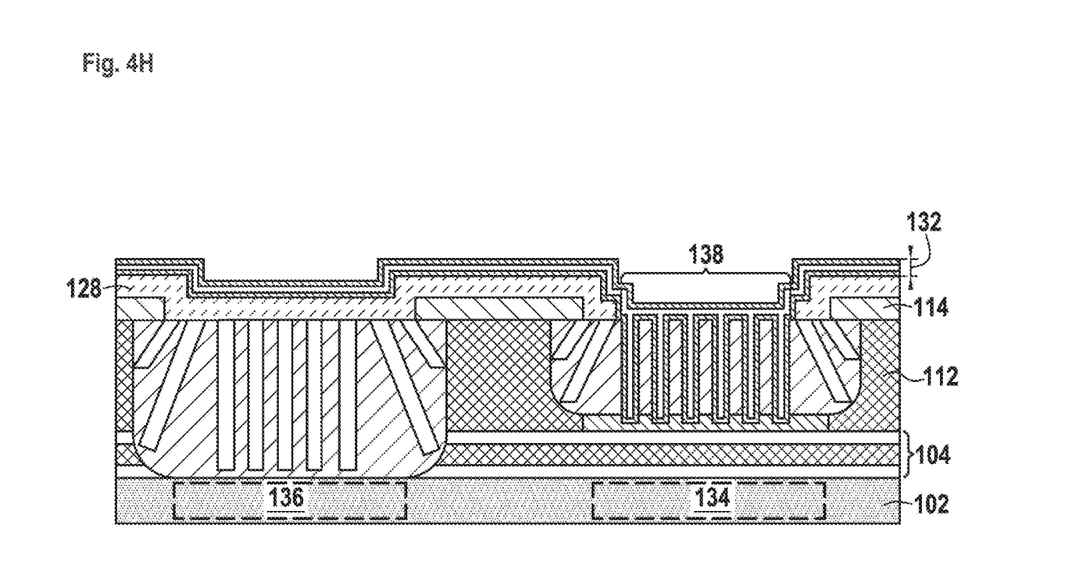
Figure 4I:
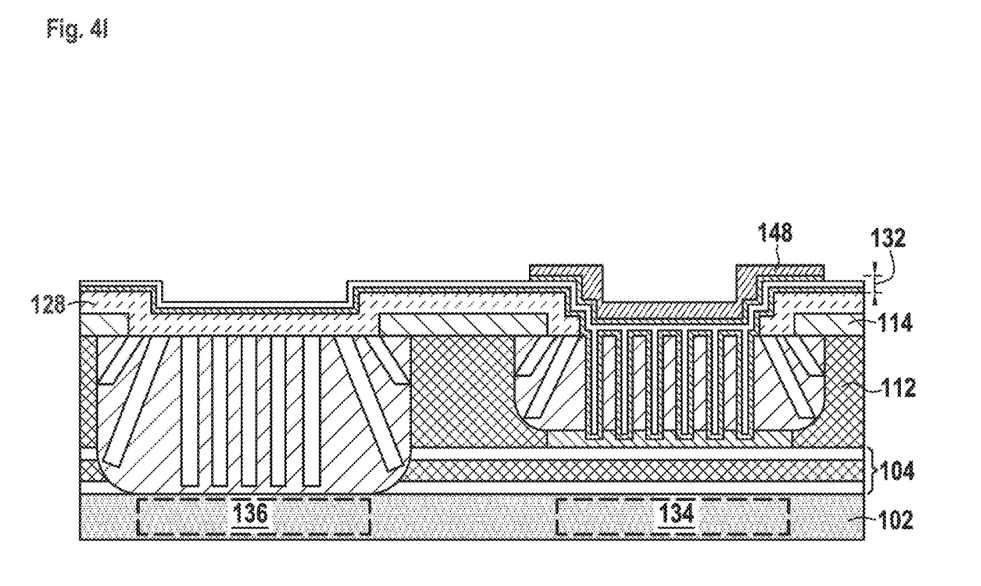
Figure 4J:
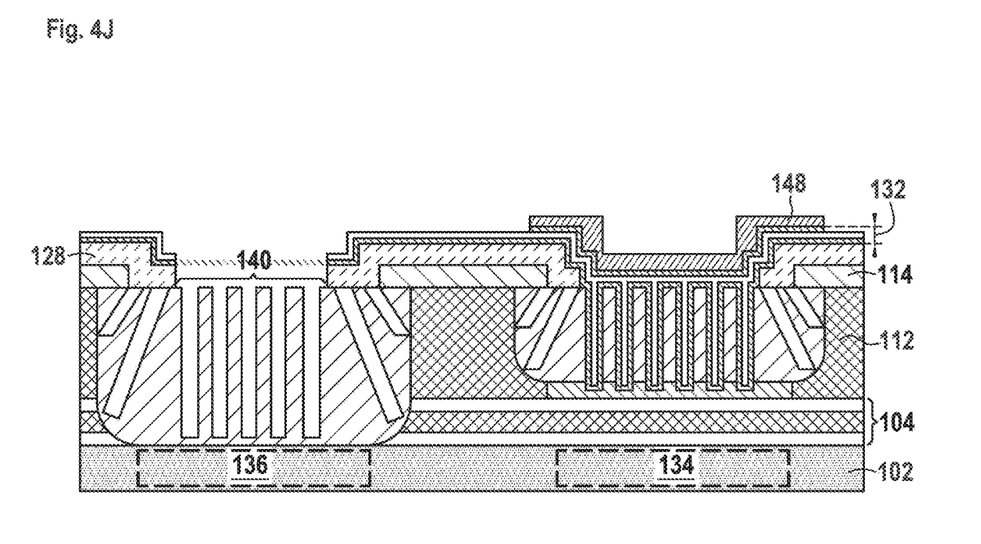
Figure 4K:
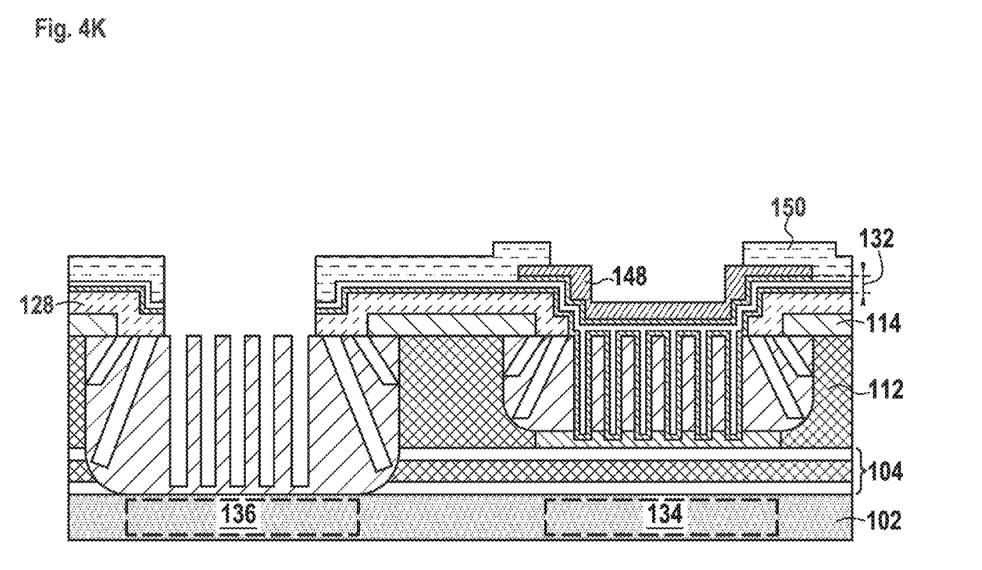
Figure 4L:
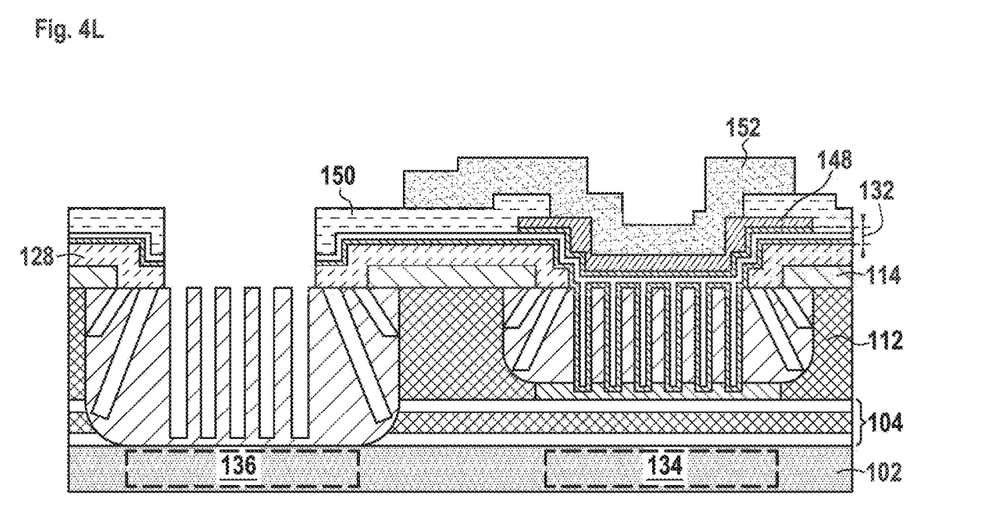
Figure 4M:
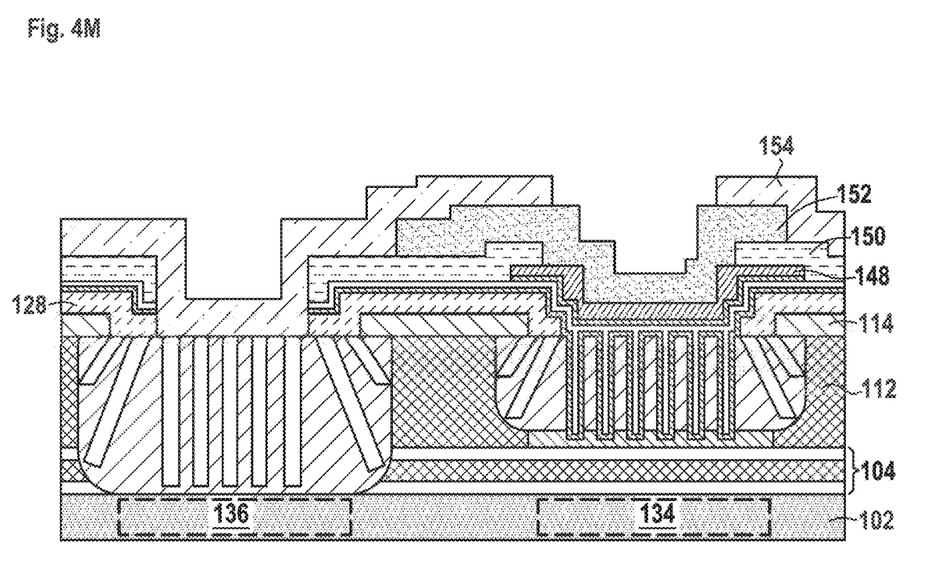
Figure 4N:
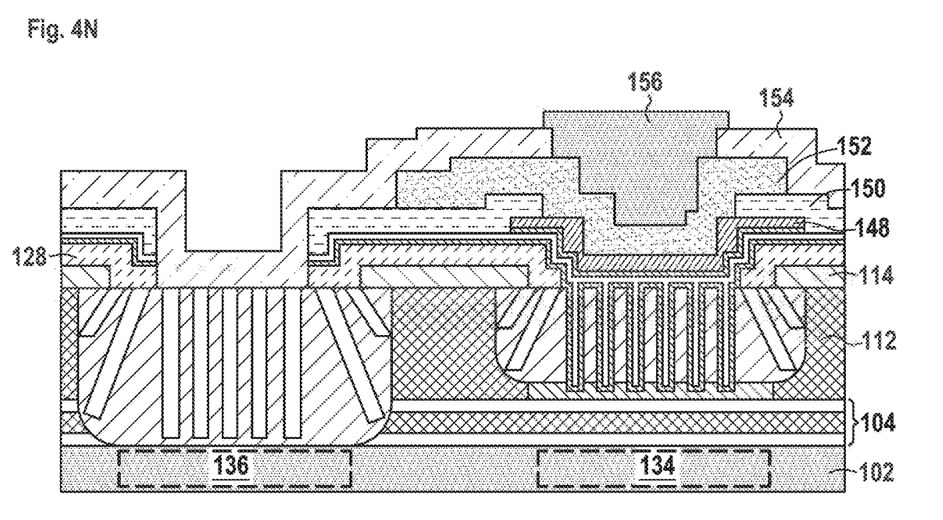
Figure 4O:
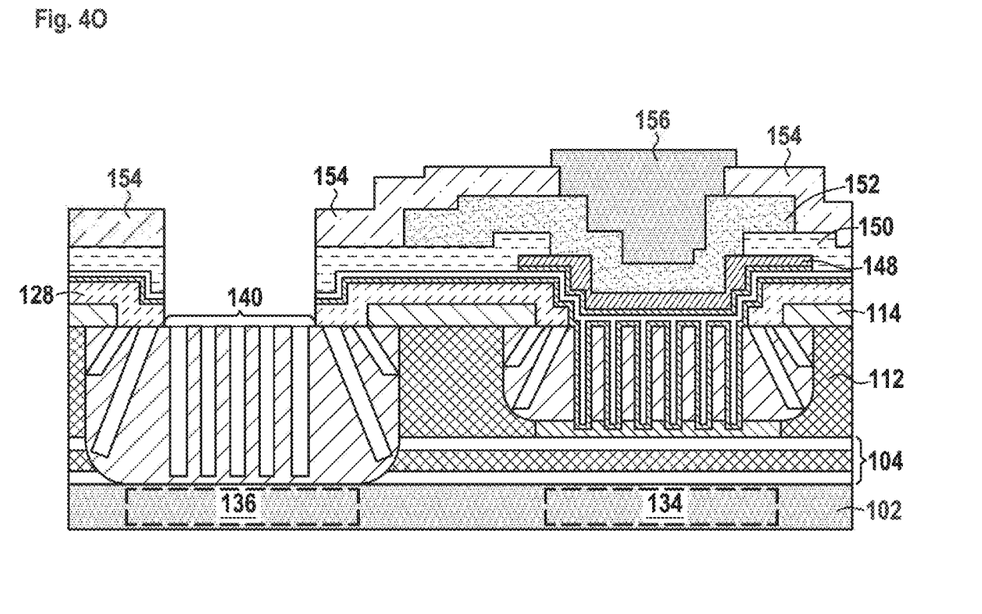
Figure 4P:
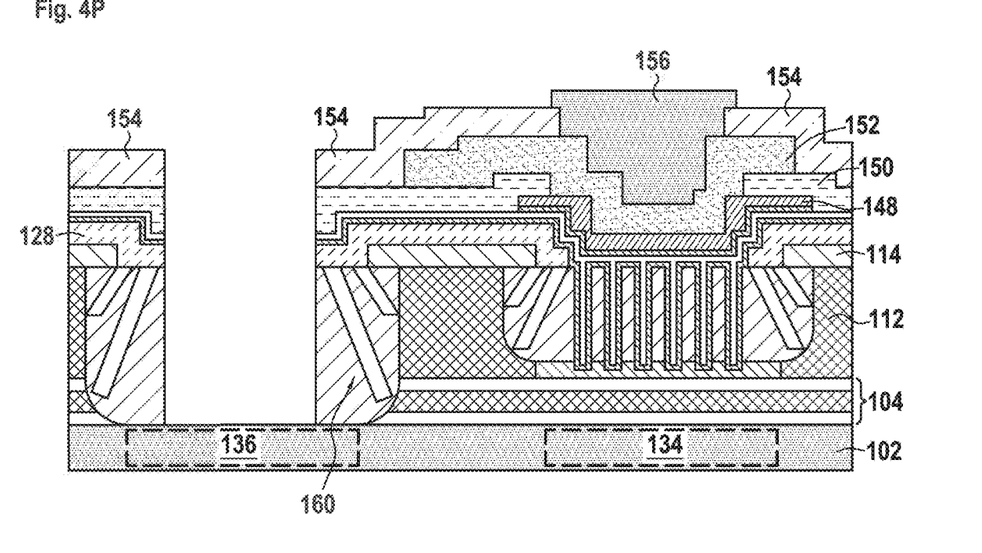

FIGS. 4A-4P illustrate steps of an example process of fabricating a semiconductor structure with an improved mechanical profile according to an embodiment. Specifically, FIGS. 4A-4P show vertical cross-section views of the semiconductor structure corresponding to the illustrated steps.

As shown in FIG. 4, the process begins by defining a circuit area 134 and a dicing area 136 on a silicon wafer 102. The dicing area 136 is adjacent to and separate from the circuit area 134.

The circuit area 134 corresponds to section of the silicon wafer 102 on which functional circuits are intended to be built. The dicing area 136 corresponds to a section of the wafer 102 on which no functional circuits are to be built and through which one or more dicing lanes are designed to pass. As mentioned above, the dicing lanes are the lanes along which the wafer 102 is diced/cut, after the wafer 102 has been processed, to obtain multiple dies or blocks each containing a given functional integrated circuit.

In FIG. 4A, a cross-section view of circuit area 134 and dicing area 136 is shown. As would be understood by a person of skill in the art, circuit area 134 and dicing area 136 extend along a plane perpendicular to the plane of the figure (into and/or out of the plane of the figure).

As would be understood by a person of skill in the art, in embodiments, one or more circuit areas 134 and one or more dicing areas 136 may be defined on wafer 102.

Next, as shown in FIG. 4B, the process includes forming a first metal layer 104 over the silicon wafer 102. The first metal layer 104 may be made of aluminum, copper (Cu), silver (Ag), or aluminum copper (AlCu) combined or not with barrier metals such as titanium, titanium nitride, tantalum, tantalum nitride. In an embodiment, as shown in FIG. 4B, the first metal layer 104 includes a stack of a titanium titanium nitride (TiTiN) layer, an AlCu layer, and a TiTiN layer.

Next, as shown in FIG. 4C, the process includes forming a barrier layer 108 over an area 110 of the top surface of the first metal layer 104. As shown in FIG. 4C, area 110 is located above the circuit area 134 of the silicon wafer 102.

In an embodiment, area 110 corresponds to the projection of circuit area 134 onto the top surface of first metal layer 104. As such, area 110 and circuit area 134 have the same geometry. In another embodiment, area 110 may extend beyond the area corresponding to the projection of circuit area 134 onto the top surface of first metal layer 104. However, area 110 excludes the area of the top surface of the first metal layer 104 lying above dicing area 136 of the silicon wafer 102, i.e., the area corresponding to the projection of dicing area 136 onto the top surface of the first metal layer 104.

In an embodiment, barrier layer 108 is formed by depositing the material of barrier layer 108 over the entire top surface of the first metal layer 104 and then patterning the deposited material such that only area 110 of the first metal layer 104 is covered by the deposited material. The role of barrier layer 108 is described further below with reference to FIG. 4F.

Next, as shown in FIG. 4D, the process includes forming a second metal layer 112 over the first metal layer 104. As shown, the first metal layer 104 is also laid on top of barrier layer 108.

Next, as shown in FIG. 4E, a first mask layer 114 is formed over the second metal layer 112 and is then patterned to have a first opening 116 above a first region 118 of the second metal layer 112 and a second opening 120 above a second region 122 of the second metal layer 112. As shown, the first region 118 of the second metal layer 112 is located above the circuit area 134 of the silicon wafer 102 as well as the barrier layer 108. The second region 122 is located above the dicing area 136 of the silicon wafer 102.

The first mask layer 114 may be made of a silicon dioxide. Alternatively, a metal may be used for the first mask layer 114, preferably a metal that is ductile (at room temperature) such as titanium, tantalum, or a metal of equivalent properties, for example.

Next, as shown in FIG. 4F, the process includes forming a first porous structure 124 in the first region 118 of the second metal layer 112 and a second porous structure 126 in the second region 122 of the second metal layer 112. In an embodiment, the second porous structure 126 extends into a region of the first metal layer 104 underlying the second region 122.

In an embodiment, the first porous structure 124 and the second porous structure 126 are formed by anodizing the second metal layer 112 in an electrolyte. The presence of first mask layer 114 ensures that porous structures are formed substantially only in the regions of the second metal layer 112 underlying the openings 116 and 120 of the first mask layer 114 (open regions).

During the anodization process, an oxide or hydroxide layer forms on the surface of the second metal layer 112 in the open regions, which is dissolved by the electrolyte along a preferential direction that is determined by an applied electrical field. As the electrolyte dissolves the oxide/hydroxide layer, fresh oxide/hydroxide forms on the surface of the second metal layer that becomes exposed. As a result, the second metal layer 112 is converted progressively, in the open regions, into porous structures 124 and 126 of anodic oxide or hydroxide having pores that extend substantially perpendicularly from the top surface, each pore being separated from the adjacent pore by a wall of oxide or hydroxide.

In an embodiment, the second metal layer 112 is made of aluminum. As such, the first porous structure 124 and the second porous structure 126 are made of anodic aluminum oxide (AAO).

In an embodiment, as shown in FIG. 4F, the first porous structure 124 includes a first set of pores 138 that extend from a top surface of the first porous structure 124 to barrier layer 108. The first set of pores 138 are substantially perpendicular to barrier layer 108. In practice, the bottoms of the first set of pores 138 may not be fully open onto the barrier layer 108. As such, in an embodiment, any residual material at the bottoms of the first set of pores 138 may be etched to fully open the first set of pores 138 onto the barrier layer 108, i.e., to expose the barrier layer 108 at the bottoms of the pores 138.

The barrier layer 108 serves to protect the first metal layer 104 during the anodization process by stopping the progression of the anodization from reaching the first metal layer 104. Additionally, the barrier layer 108 may protect the first metal layer 104 when any residual material at the bottoms of the first set of pores 138 is etched out. In an embodiment, the barrier layer 108 may be made of Tungsten or of an equivalent material resistant to anodization in the used electrolyte.

Depending on the conditions of the anodization process, the first porous structure 124 may also include lateral pores 146 located near the edges of the first mask layer 114 (at either side of the first set of pores 138), which do not extend substantially perpendicularly towards the first metal layer 104 but rather diagonally/sideways towards the second metal layer 112, as shown in FIG. 4F. Lateral pores 146 are typically due to the fact that the applied electrical field may be non-uniform and/or weaker near the edges of the first mask layer 114, which results in lateral pores 146 not having the desired directionality.

The second porous structure 126 includes a second set of pores 140 that extend from a top surface of the second porous structure 126 to the silicon wafer 102. The second set of pores 140 are substantially perpendicular to the silicon wafer 102. In practice, the bottoms of the second set of pores 140 may or may not be fully open onto the silicon wafer 102. In addition, as with the first porous structure 124, the second porous structure 126 may also include lateral pores 144 located near the edges of the first mask layer 114 (at either side of the second set of pores 140), which do not extend substantially perpendicularly towards the silicon wafer 102 but rather diagonally/sideways towards the second metal layer 112, as shown in FIG. 4F.

It is noted herein that the absence of the barrier layer 108 from underneath the second region 122 of the second metal layer 112 allows for the anodization process to progress into the first metal layer 104 and to reach the silicon wafer 102.

In embodiments, the first porous structure 124 and the second porous structure 126 may be formed using the same anodization step(s) or using different anodization step(s). The anodization process and the conditions affecting it being well-known in the art, a person of skill in the art would fully appreciate the different ways according to which the first porous structure 124 and the second porous structure 126 may be formed. For example, the person of skill in the art would appreciate the anodization control parameters necessary for the formation of the first porous structure 124 and the second porous structure 126, including the parameters allow for the anodization process to stop once the first set of pores 138 have reached the first metal layer 104 and the second set of pores 140 have reached the silicon wafer 102.

Figure 5A:
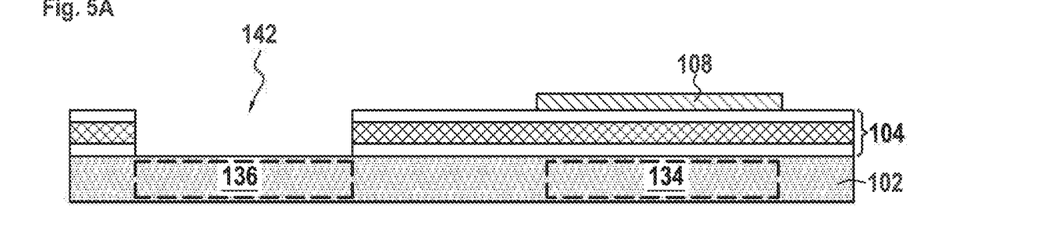
FIGS. 5A-5D illustrate steps of another example process of fabricating a semiconductor structure according to an embodiment.

According to another embodiment, an additional process step, shown in FIG. 5A, is introduced between the steps shown in FIGS. 4C and 4D. Namely, after forming the barrier layer 108 over the area 110 of the top surface of the first metal layer 104, the first metal layer 104 is patterned to create an opening 142 therein over the dicing area 136 of the silicon wafer 102. The opening 142 exposes the dicing area 136 of the silicon wafer 102.

Figure 5B:
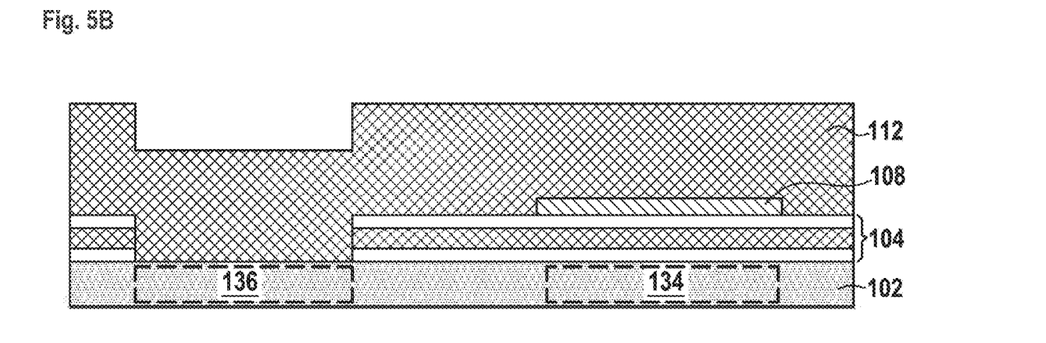
Figure 5C:
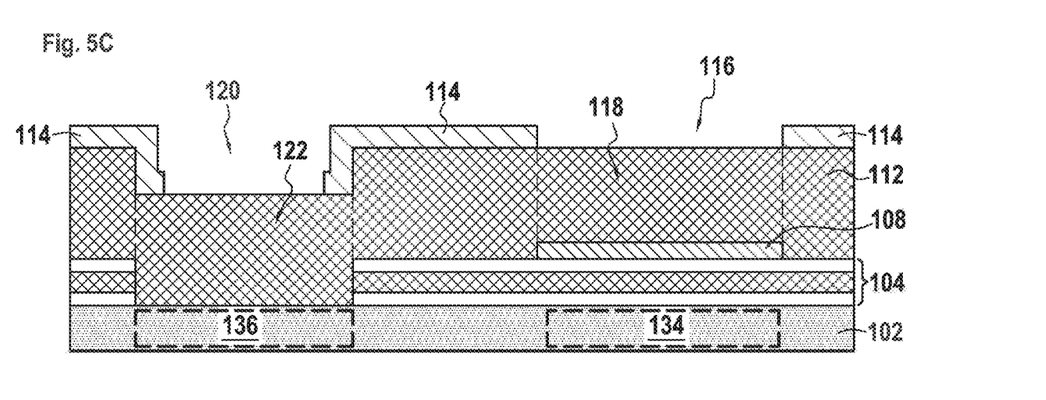
Figure 5D:
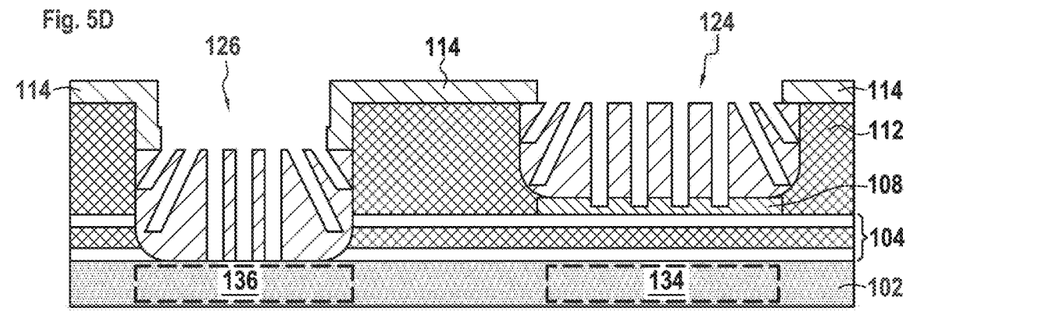

The subsequent steps of the process according to this embodiment are identical to the process steps described above with reference to FIGS. 4D-4F and further described below with reference to FIGS. 4G-4P. For illustration, FIGS. 5B, 5C, and 5D show the process steps according to this embodiment which correspond to the process steps described above with reference to FIGS. 4D-4F, namely the formation of the second metal layer 112, the formation of the first mask layer 114 with openings 116 and 120, and the formation of the first porous structure 124 in the first region 118 of the second metal layer 112 and of the second porous structure 126 in the second region 122 of the second metal layer 112. It is noted that according to this embodiment the second metal layer 112 may be formed over the first metal layer 104, the barrier layer 108, and the dicing area 136 of the silicon wafer 102. On advantage of this embodiment is that with the first metal layer 104 patterned as described, before forming the second metal layer 112, the anodization process may be performed in fewer steps as, in this case, the formation of the first porous structure 124 and the second porous structure 126 would require the anodization of layers of substantially equal depth (i.e., the depth of layer 112).

Returning to the example process of FIGS. 4A-4P, the process then continues with the step(s) shown in FIG. 4G, which include depositing a second mask layer 128 over the first mask layer 114, the first porous structure 124, and the second porous structure 126; and patterning the second mask layer 128 to create an opening 130 therein over the first set of pores 138 of the first porous structure 124. As such, the second hard mask layer 128 covers the lateral pores 146 of the first porous structure 124. This ensures that the pores 146 are not used for circuitry built therein. This is advantageous because these pores are typically difficult to quantify in terms of electrical contribution (e.g., capacitance, resistance, etc.) and may be prone to inducing halogen corrosion into the resulting product when subsequent process steps use a halogen-based precursor (e.g., the MIM stack Atomic Layer Deposition (ALD) steps described further below).

As shown in FIG. 4G, according to this embodiment, the second mask layer 128 also covers the second set of pores 140 of the second porous structure 126. Additionally, according to this embodiment, the second hard mask layer 128 also covers the lateral pores 144 of the second porous structure 126.

Next, as shown in FIG. 4H, a metal-insulator-metal (MIM) stack 132 is deposited over the second mask layer 128. In an embodiment, the MIM stack 132 is deposited using ALD. Due to the opening 130, the MIM stack 132 is formed in the first set of pores 138 of the first porous structure 124. Namely, the successive layers of metal, insulator, and then metal follow the contours of the first porous structure 124 resulting in the MIM stack 132 being embedded inside the first set of pores 138 of the first porous structure 124.

Subsequently, as shown in FIG. 4I, a conductive material (e.g., Aluminum) may optionally be deposited and patterned to form a top electrode 148 which contacts the top metal layer of the MIM stack 132. In an embodiment, as shown in FIG. 4I, in forming the top electrode 148, the top metal layer of the MIM stack 132 is removed in the areas where the top electrode 148 does not extend. In other words, the top metal layer of the MIM stack 132 remains only underneath the top electrode 148. This reduces the possibility of a short leakage occurring between the top electrode 148 and the bottom electrode (described further below).

Next, as shown in FIG. 4J, the process includes removing the MIM stack 132 and the second mask layer 128 over the second set of pores 140 of the second porous structure 126, to expose the second set of pores 104. The MIM stack may be removed by dry etching.

Subsequently, as shown in 4K, an insulating material may optionally be deposited and patterned to form insulator layer 150.

Then, as shown in FIG. 4L, a conductive material (e.g., Aluminum) may optionally be deposited and patterned to form a contact layer 152 which contacts top electrode 148.

Then, as shown in FIG. 4M, a passivation layer 154 may optionally be formed and patterned. The passivation layer 154 may be formed using a plasma-enhanced chemical vapor deposition (PECVD) processed and patterned using a dry etching process.

Then, as shown in FIG. 4N, a conductive material (e.g., Gold Nitride) may optionally be deposited and patterned to form a top electrode contact 156.

Next, as shown in FIG. 4O, the process may include removing any formed layers over the second set of pores 140 of the second porous structure 126 to expose the second set of pores 140. For example, in an embodiment, the second set of pores 140 are covered directly by the passivation layer 154, which is removed over the second set of pores 140 to expose them. The passivation layer 154 may be removed by a dry etching process.

Subsequently, as shown in FIG. 4P, the second set of pores 140 may be etched to expose the dicing area 136 of the silicon wafer 102. In an embodiment, an isotropic wet etching step is used to remove the second set of pores 140.

With the dicing area 136 exposed, the silicon wafer 102 may then be diced along a dicing lane that passes through the dicing area 136. The resulting structure (i.e., the structure to the right of the dicing area 136 in FIG. 4P) is a semiconductor structure with AAO embedded circuitry (a capacitor in this case) which has an improved mechanical profile, including reduced delamination, chipping, and cracks in the supporting substrate. In addition, the resulting structure benefits from the continued presence of a portion 160 of the second porous structure 126 at its edge, which reduces the influent of humidity and the risk of leakage, particularly due to the wafer bumping process.

Figure 6A:
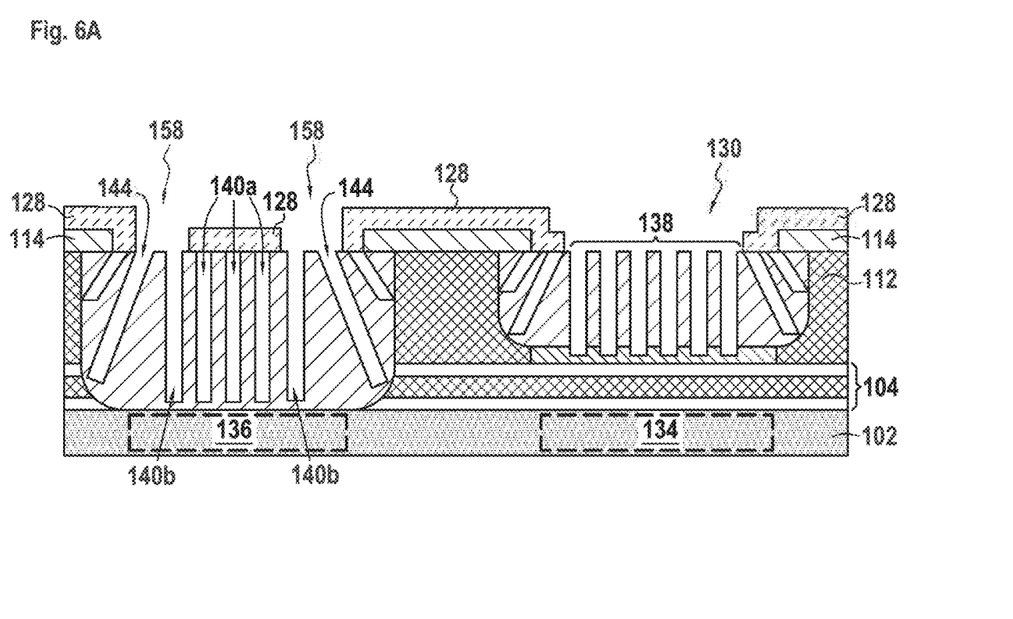
FIGS. 6A-6D illustrate steps of another example process of fabricating a semiconductor structure according to an embodiment.

According to another embodiment, the process may be modified at the step described above with reference to FIG. 4G. Namely, as shown in FIG. 6A, the second mask layer 128 may be patterned to have openings 158 over at least some of the lateral pores 144 of the second porous structure 126 and/or some of the second set of pores 140 of the second porous structure 126, adjacent to the lateral pores 144. An opening 130 over the first set of pores 138 of the first porous structure 124 is also formed as in FIG. 4G.

Figure 6B:
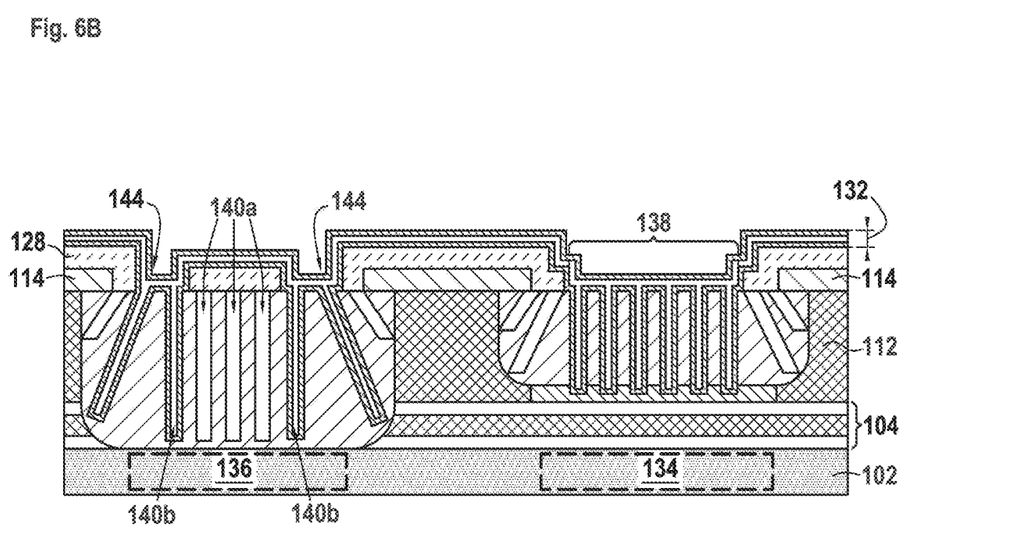

Subsequently, as shown in FIG. 6B, the MIM stack 132 may be formed. Due to the presence of the openings 158, the MIM stack 132 is formed inside the exposed pores of the second porous structure 126. In FIG. 6B, this includes some of the lateral pores 144 and some of the second set of pores 140 immediately adjacent to the exposed lateral pores. In contrast, a central subset 140a of the second set of pores 140 is protected by the second hard mask layer 128 and is not filled.

The process may then continue to the step shown in FIG. 4I.

Subsequently, in the step corresponding to the step shown in FIG. 4J, the process may include removing the MIM stack 132 and the second mask layer 128 over the central subset 140a of the second set of pores 140 of the second porous structure 126.

The process may then continue according to the steps shown in FIGS. 4K, 4L, 4M, and 4N.

Figure 6C:
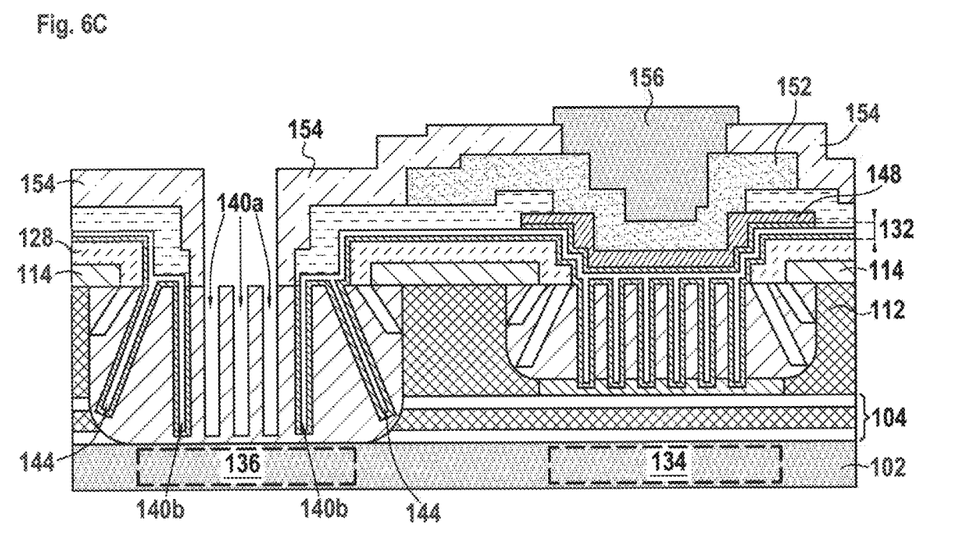

Then, as shown in FIG. 6C, the process may include removing any formed layers over the central subset 104a of the second set of pores 140 of the second porous structure 126. For example, the passivation layer 154 may be removed over the central subset 140a of the second set of pores 140 to expose them.

Figure 6D:
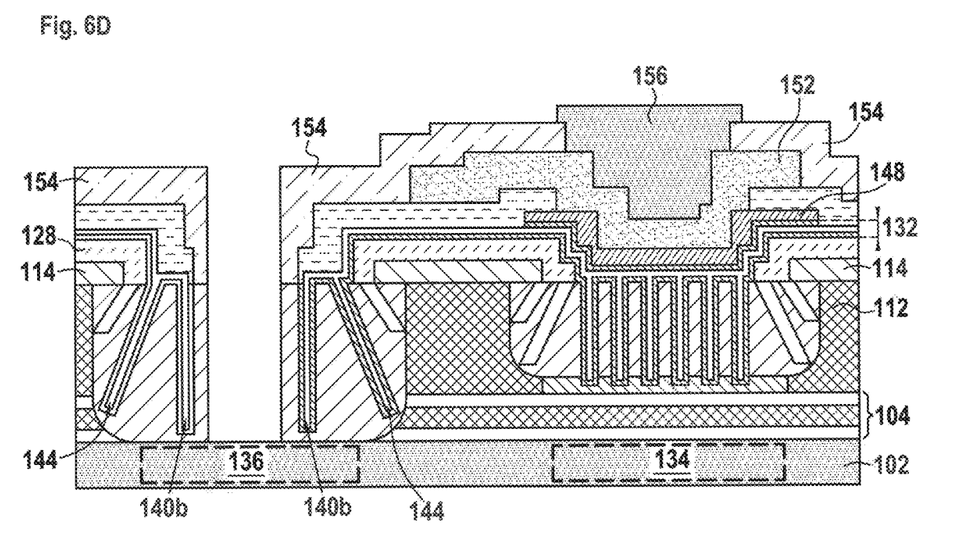

Subsequently, as shown in FIG. 6D, the central subset 140a of the second set of pores 140 may be etched to expose the dicing area 136 of the silicon wafer 102. With the dicing area 136 exposed, the silicon wafer 102 may then be diced along a dicing lane that passes through the dicing area 136. The resulting structure has similar advantages as the structure resulting from the earlier described embodiment. Additionally, the filling with MIM of some of the pores of the second porous structure 126 improves the mechanical strength of the resulting structure, particularly at the edges.

ADDITIONAL VARIANTS

Although the present invention has been described above with reference to certain specific embodiments, it will be understood that the invention is not limited by the particularities of the specific embodiments. Numerous variations, modifications and developments may be made in the above-described embodiments within the scope of the appended claims.

The invention claimed is:

1. A method of fabricating a semiconductor structure, the method comprising:
    defining a circuit area and a dicing area on a silicon wafer;
    forming a first metal layer over the silicon wafer;
    forming a barrier layer over an area of a top surface of the first metal layer located above the circuit area of the silicon wafer;
    forming a second metal layer over the first metal layer;
    forming a first porous structure in a first region of the second metal layer located above the circuit area and a second porous structure in a second region of the second metal layer located above the dicing area, wherein the first porous structure includes a first set of pores that extend from a top surface of the first porous structure to the barrier layer, and wherein the second porous structure includes a second set of pores that extend from a top surface of the second porous structure to the silicon wafer;
    forming a metal-insulator-metal stack in the first set of pores of the first porous structure; and
    etching the second set of pores of the second porous structure to expose the dicing area of the silicon wafer.

2. The method of claim 1, further comprising:
    forming the second metal layer over the first metal layer and the barrier layer.

3. The method of claim 1, further comprising:
    patterning the first metal layer to create an opening in the first metal layer over the dicing area of the silicon wafer.

4. The method of claim 3, further comprising:
    forming the second metal layer over the first metal layer, the barrier layer, and the dicing area of the silicon wafer.

5. The method of claim 1, further comprising:
    forming a first mask layer over the second metal layer, the first mask layer having a first opening above the first region of the second metal layer and a second opening above the second region of the second metal layer; and
    anodizing the first region and the second region of the second metal layer to form the first porous structure and the second porous structure.

6. The method of claim 5, further comprising:
    depositing a second mask layer over the first mask layer, the first porous structure, and the second porous structure; and
    patterning the second mask layer to create an opening therein over the first set of pores of the first porous structure.

7. The method of claim 6, wherein the second mask layer covers the second set of pores of the second porous structure.

8. The method of claim 6, wherein the second porous structure includes lateral pores located at either side of the second set of pores of the second porous structure, and wherein the second mask layer includes openings over at least some of the lateral pores of the second porous structure.

9. The method of claim 8, further comprising:
    forming the metal-insulator-metal stack into the first set of pores of the first porous structure and into the at least some of the lateral pores of the second porous structure.

10. The method of claim 6, wherein the second porous structure includes lateral pores located at either side of the second set of pores of the second porous structure, and wherein the second mask layer fully covers the second set of pores and the lateral pores of the second porous structure.

11. The method of claim 6, further comprising:
    depositing the metal-insulator-metal stack over the second mask layer.

12. The method of claim 11, further comprising:
    removing the metal-insulator-metal stack and the second mask layer over a central subset of the second set of pores of the second porous structure.

13. The method of claim 6, further comprising:
    removing the metal-insulator-metal stack and the second mask layer over the entirety of the second set of pores of the second porous structure.

14. The method of claim 1, further comprising:
    dicing the silicon wafer along a dicing lane through the dicing area.

15. The method of claim 14, wherein the dicing is part of a dicing before grinding process or a hybrid laser grooving-dicing before grinding process.

* * * * *